United States Patent
Chuang et al.

(10) Patent No.: US 10,401,923 B2
(45) Date of Patent: Sep. 3, 2019

(54) CASING AND REDUNDANT POWER SUPPLY THEREOF

(71) Applicant: FSP TECHNOLOGY INC., Taoyuan (TW)

(72) Inventors: Tung-Jung Chuang, Taoyuan (TW); Cheng-Wen Huang, Taoyuan (TW)

(73) Assignee: FSP TECHNOLOGY INC., Taoyuan (TW)

( * ) Notice: Subject to any disclaimer, the term of this patent is extended or adjusted under 35 U.S.C. 154(b) by 279 days.

(21) Appl. No.: 15/259,027

(22) Filed: Sep. 7, 2016

(65) Prior Publication Data

US 2017/0139451 A1 May 18, 2017

(30) Foreign Application Priority Data

Nov. 12, 2015 (CN) ..................... 2015 2 0898840 U

(51) Int. Cl.

| | |
|---|---|
| *G06F 1/18* | (2006.01) |
| *G06F 1/20* | (2006.01) |
| *H05K 7/14* | (2006.01) |
| *H05K 7/20* | (2006.01) |
| *G06F 1/26* | (2006.01) |

(52) U.S. Cl.
CPC ............. *G06F 1/189* (2013.01); *G06F 1/181* (2013.01); *G06F 1/188* (2013.01); *G06F 1/20* (2013.01); *G06F 1/263* (2013.01); *H05K 7/1427* (2013.01); *H05K 7/20545* (2013.01); *H05K 7/20554* (2013.01)

(58) Field of Classification Search
CPC ............ G06F 1/189; G06F 1/181; G06F 1/20; H05K 7/1427; H05K 7/20545; H05K 7/20554

See application file for complete search history.

(56) References Cited

U.S. PATENT DOCUMENTS

| 5,612,854 A * | 3/1997 | Wiscombe | G06F 1/184 |
| | | | 361/679.6 |
| 5,761,045 A * | 6/1998 | Olson | G06F 1/189 |
| | | | 312/223.2 |
| 6,181,552 B1 * | 1/2001 | Neville, Jr. | G06F 1/184 |
| | | | 361/679.58 |
| 9,301,420 B2 * | 3/2016 | Bailey | H05K 7/1492 |
| 9,451,721 B1 * | 9/2016 | Shih | G06F 1/263 |
| 2011/0261526 A1 * | 10/2011 | Atkins | G06F 1/187 |
| | | | 361/679.33 |

\* cited by examiner

*Primary Examiner* — James Wu
*Assistant Examiner* — Hung Q Dang
(74) *Attorney, Agent, or Firm* — JCIPRNET

(57) ABSTRACT

A casing including a first body and a locking plate is provided, the locking plate is installed to the first body, and the locking plate extends inward to form a frame, so as to lock the casing to a main chassis of a desktop computer. Compared with the existing technique, the casing is directly locked to the main chassis of the desktop computer from exterior to interior through the locking plate, i.e. the casing is adapted to install the redundant power supply without changing an internal configuration of the main chassis or changing an outline dimension of the main chassis or the casing. Moreover, in terms of material purchase, it is unnecessary to purchase casings of other dimensions, but only one type of casings are used to produce general power supplies and redundant power supplies, so as to effectively save the manufacturing cost. Moreover, a redundant power supply is provided.

11 Claims, 5 Drawing Sheets

CASING AND REDUNDANT POWER SUPPLY THEREOF

CROSS-REFERENCE TO RELATED APPLICATION

This application claims the priority benefit of Chinese application serial no. 201520898840.4, filed on Nov. 12, 2015. The entirety of the above-mentioned patent application is hereby incorporated by reference herein and made a part of this specification.

BACKGROUND OF THE INVENTION

Field of the Invention

The invention relates to a technical field of electric power equipment, and particularly relates to a casing and a redundant power supply thereof.

Description of Related Art

In order to cope with a specification of an advanced technology extended (ATX) motherboard, a power supply of a conventional desktop computer generally adopts a casing of the ATX specification (a dimension thereof is 150 mm (W)*86 mm (H)*190 mm (D)), so that the power supply of the desktop computer is referred to as an ATX power supply. However, only one power supply is set in the casing, and when the power supply is malfunctioned or in non-operation, since none other power supply exists for backup, data of the desktop computer cannot be backed up in time, which probably causes an irrecoverable loss to a user.

Presently, although a redundant power supply capable of providing the aforementioned backup function is provided in the market, it is generally used in high-end products such as server systems, industrial computers, etc., and in order to cope with the aforementioned product demand, a casing dimension and a locking structure for locking the casing to a main chassis are also specially designed. Regarding a mini redundant power supply, a casing dimension thereof is 150 mm (W)*84 mm (H)*190 mm (D), which is the closest to that of the casing of the ATX power supply, though a locking plate thereof is in a splaying form, so that it is unable to lock the casing installed with the redundant power supply to the main chassis of the desktop computer.

Therefore, it is necessary to provide an improved casing structure and a redundant power supply thereof to overcome the aforementioned defect.

SUMMARY OF THE INVENTION

In view of the above problems in the existing technique, the invention is directed to a casing, which is adapted to install a redundant power supply without changing an internal configuration of a main chassis, such that a desktop computer has a function of a backup power.

The invention is directed to a redundant power supply installed in the aforementioned casing, the redundant power supply has a small volume, and two of the redundant power supplies are adapted to be installed in the casing, such that the casing is adapted to install the redundant power supplies, and thus a desktop computer has a function of a backup power.

The invention provides a casing including a first body and a locking plate, the locking plate is installed to the first body, the first body has an internal space for accommodating two redundant power supplies, and the locking plate extends inward to form a frame, so as to lock the casing to a main chassis of a desktop computer.

Compared with the existing technique, since the locking plate of the invention extends inward to form a frame (i.e. the locking plate is designed into an invagination form), the casing is adapted to be directly locked to the main chassis of the desktop computer from exterior to interior through the locking plate, i.e. the casing is adapted to install the redundant power supply without changing an internal configuration of the main chassis or changing an outline dimension of the main chassis or the casing, such that the desktop computer has a function of a backup power. Moreover, in terms of material purchase, it is unnecessary to purchase casings of other dimensions, but only one type of the casings are used to produce general power supplies and redundant power supplies of the desktop computer, so as to effectively save the manufacturing cost.

To be specific, at least one locking hole is configured on the locking plate, and the casing is locked to the main chassis of the desktop computer through the locking hole, and the locking plate is partially folded inward to the internal space.

To be specific, a length of the first body is 190 mm, a width of the first body is 150 mm, and a height of the first body is 86 mm.

Preferably, the casing further includes at least one guide plate disposed on an inner sidewall of the internal space.

Preferably, the casing further includes a separation plate, which is formed by the guide plate by vertically extending towards a center of the internal space. To be specific, the separation plate is perpendicular to or parallel with a length direction of the first body.

Selectively, the casing further includes a casing circuit board, a direct current (DC)-to-DC converter circuit board and a first power management bus circuit board, the casing circuit board, the DC-to-DC converter circuit board and the first power management bus circuit board are disposed in the internal space, and the casing circuit board is configured with a connection slot for plugging the redundant power supply, and the DC-to-DC converter circuit board is electrically connected to the casing circuit board.

The invention further provides a redundant power supply, which is disposed in the aforementioned casing. To be specific, the redundant power supply includes a second body, a first circuit board, a second circuit board and a third circuit board. The first circuit board, the second circuit board and the third circuit board are all disposed in the second body, and the second circuit board and the third circuit board are all perpendicular to and electrically connected to the first circuit board, and the second circuit board and the third circuit board are disposed along a length direction of the second body and are respectively close to two inner sidewalls of the second body opposite to each other.

Compared with the existing technique, since a length of a general power supply casing (the ATX casing) of the desktop computer is relatively short, and the casing has the aforementioned improvement (the locking plate is designed into an invagination form), the previous redundant power supply cannot be put into the casing of the invention. Therefore, in the redundant power supply of the invention, the second circuit board and the third circuit board are all perpendicular to the first circuit board, and the second circuit board and the third circuit board are disposed along a length direction of the second body and are respectively close to two inner sidewalls of the second body opposite to each other, i.e. a part of the circuit boards in the redundant power supply is set in an upright manner, so as to reduce an overall volume of the redundant power supply, such that the redundant power supply is adapted to be put into the casing. Moreover, the improved redundant power supply can be selected in manufacturing to complete manufacturing the backup power equipment, so as to effectively save the manufacturing cost.

To be specific, the first circuit board is a main circuit board and includes an electrical terminal, where the electrical terminal is located at an output end of the redundant power supply and is inserted into the connection slot of the casing. The second circuit board is a standby power supply circuit board, the third circuit board is a second power management bus circuit board, and the third circuit board is electrically connected to the first power management bus circuit board disposed in the casing.

Selectively, the redundant power supply further includes a fan disposed outside the second body and located above the electrical terminal.

Selectively, the redundant power supply further includes a heat sink disposed inside the second body and located at an input end of the redundant power supply.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
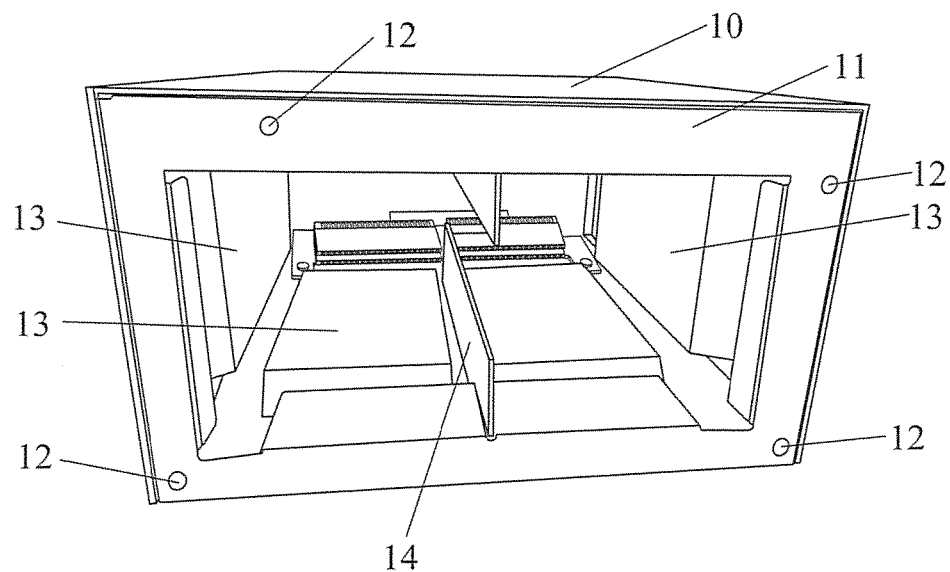
FIG. 1 is a structural diagram of a casing according to an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

Figure 2:
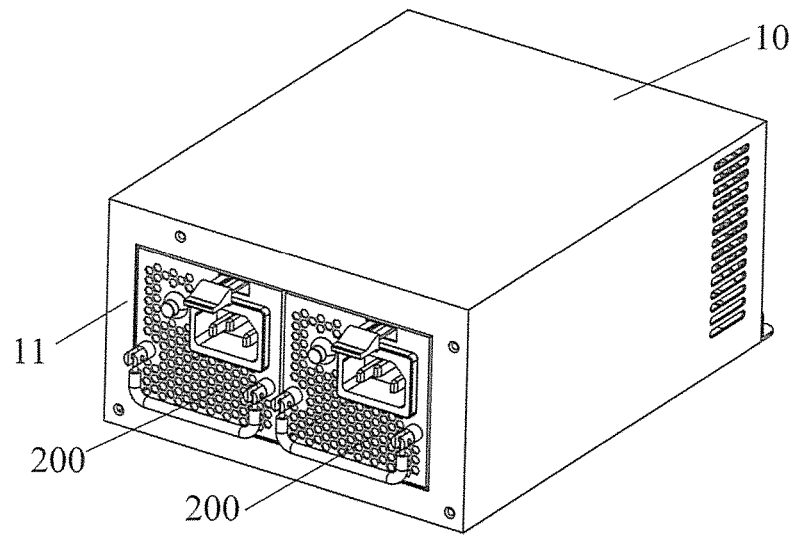
FIG. 2 is a structural diagram of the casing of FIG. 1 installed with two redundant power supplies.
Figure 3:
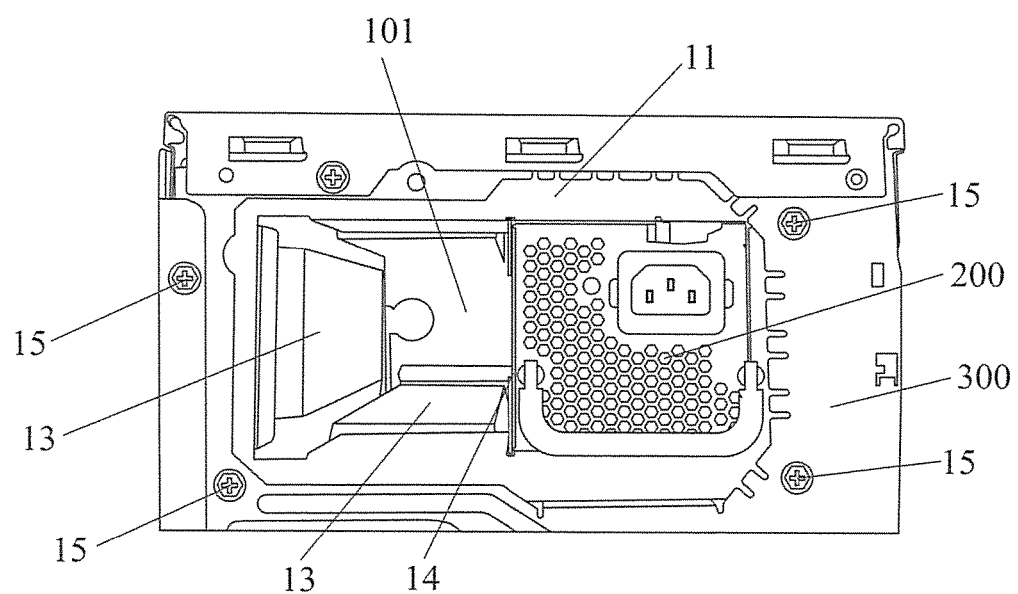
FIG. 3 is a structural diagram of the casing of FIG. 1 locked to a main chassis of a desktop computer.

Referring to FIG. 1, a casing 100 of the invention includes a first body 10, a locking plate 11, locking holes 12, guide plates 13 and a separation plate 14. The first body 10 has an internal space 101 (shown in FIG. 3) for accommodating two redundant power supplies 200 (shown in FIG. 2). The locking plate 11 is installed to the first body 10 and extends inward to form a frame, so as to lock the casing 100 to a main chassis of a desktop computer. To be specific, the locking plate 11 is partially folded inward to the internal space 101, and the guide plates 13 and the separation plate 14 are all located in the internal space 101. Four locking holes 12 are set on the locking plate 11, and three of the locking holes 12 are located at different corners of the locking plate 11. Locking members 15 (for example, screws) may penetrate through the locking holes 12 to lock the casing 100 to the main chassis 300 (shown in FIG. 3) of the desktop computer. The four guide plates 13 are respectively disposed on four e sidewalls of the internal space 101, and the redundant power supply 200 can be guided for inserting into the casing 100 through the guide plates 13. The separation plate 14 is formed by a guide plate 13 by vertically extending towards a center of the internal space 101. As shown in FIG. 1, the separation plate 14 is adjacent to the guide plate 13 disposed on the bottom of the casing 100, and is located in the middle of the casing 100. The two redundant power supplies 200 can be separated in left and right separation through the separation plate 14, i.e. in the present embodiment, the separation plate 14 is perpendicular to a length direction of the first body 10. Certainly, the separation plate 14 can also be parallel to the length direction of the first body 10. In this way, the two redundant power supplies are separated in upper and lower separation. The redundant power supplies 200 can be stably installed in the casing 100 through the guide plates 13 and the separation plate 14, and the two redundant power supplies 200 are prevented to collide with each other due to an external force, or inclination of the two redundant power supplies 200 due to the external force is prevented to avoid influencing power transmission.

It should be noted that in the present embodiment, the casing 100 has an advanced technology extended (ATX) specification, and a length of the first body 10 is 190 mm, a width thereof is 150 mm and a height thereof is 86 mm.

Figure 4:
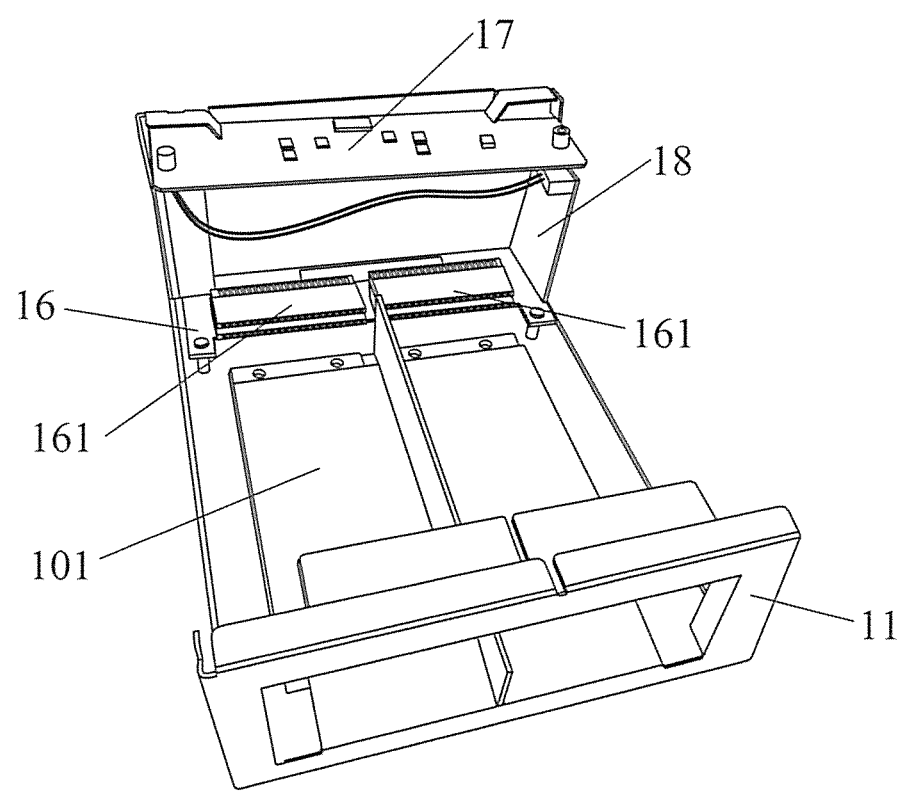
FIG. 4 is a structural diagram showing an internal portion of the casing of FIG. 1.

Moreover, referring to FIG. 4, the casing 100 further includes a casing circuit board 16 disposed in the internal space 101, and the casing circuit board 16 is configured with connection slots 161 for plugging the redundant power supplies 200.

It should be noted that in the present embodiment, the numbers of the locking holes 12 and the guide plates 13 are not limited by the invention, which can be decided according to an actual design requirement.

Figure 5:
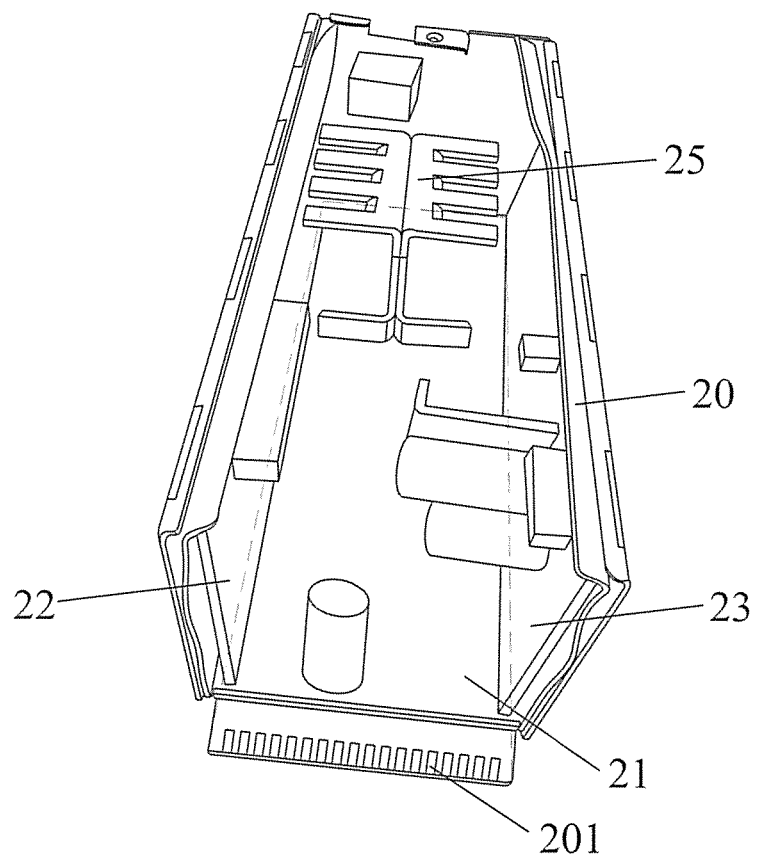
FIG. 5 is a structural diagram of a redundant power supply according to an embodiment of the invention.
Figure 6:
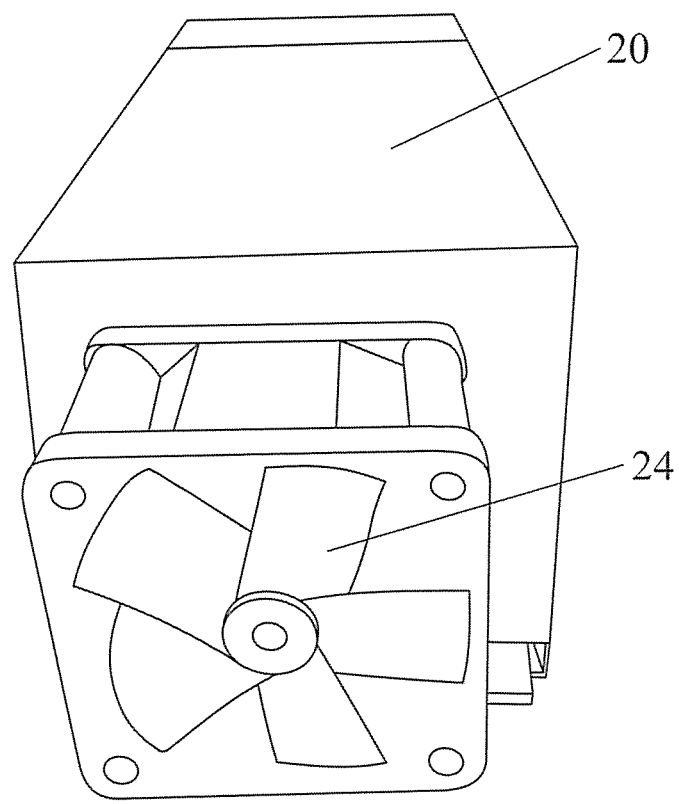
FIG. 6 is another structural diagram of the redundant power supply of FIG. 5.

Referring to FIG. 5 and FIG. 6, the redundant power supply 200 disposed in the casing 100 includes a second body 20, a first circuit board 21, a second circuit board 22 and a third circuit board 23. The first circuit board 21, the second circuit board 22 and the third circuit board 23 are all disposed in the second body 20, and the second circuit board 22 and the third circuit board 23 are all perpendicular to the first circuit board 21. The first circuit board 21 is disposed along a length direction of the second body 20, and is close to a bottom plat of the second body 20. The second circuit board 22 and the third circuit board 23 are all disposed along the length direction of the second body 20 and are respectively close to two inner sidewalls of the second body 20 opposite to each other. It should be noted that the first circuit board 21 is a main circuit board of the redundant power supply 200, and is used for converting an alternating current (AC) power received from an input end of the redundant power supply 200 into a direct current (DC) power, though the invention is not limited thereto, and the first circuit board 21 may also convert a DC power received from the input end into a DC power. The second circuit board 22 is a standby power supply circuit board, which is used for providing power to a part of circuit components when the redundant power supply 200 in the sleep mode, and is used for waking up the redundant power supply 200. The third circuit board 23 is a power management bus (PMBus) circuit board, which is adapted to connect a remote end to monitor a usage situation of other redundant power supplies. Moreover, as shown in FIG. 4, a DC-to-DC converter circuit board 17 and a PMBus circuit board 18 of the whole backup power are configured at the back of the casing 100, where the PMBus circuit board 18 is electrically connected to the third circuit boards (PMBus circuit boards) 23 of the two redundant power supplies 200 for monitoring a usage situation of the whole backup power.

To be specific, as shown in FIG. 5, the first circuit board 21 is configured with a power processing unit and an electrical terminal 201, where the power processing unit is electrically connected to the electrical terminal 201, and the electrical terminal 201 is located at an output end of the redundant power supply 200, and is inserted into the connection slot 161 (shown in FIG. 4) of the casing 100 for electrical connection. Since the connection slot 161 is disposed on the casing circuit board 16, the connection slot 161 can be electrically connected to an output cable and the DC-to-DC converter circuit board 17 through the casing circuit board 16, so as to transmit the power of the redundant power supply 200 to the output cable and the DC-to-DC converter circuit board 17. An output power of the redundant power supply 200 is 450 watts to 520 watts, and the DC-to-DC converter circuit board 17 may convert the output power for providing a different output power to another output cable.

Further, as shown in FIG. 5 and FIG. 6, the redundant power supply 200 further includes a fan 24 and a heat sink 25, where the fan 24 is disposed outside the second body 20, and the heat sink 25 is disposed inside the second body 20 and located at an input end of the redundant power supply 200. After the electrical terminal 201 of the redundant power supply 200 is inserted into the connection slot 161 of the casing 100, the fan 24 can be disposed in an accommodating space above the connection slot 161, so as to effectively make use of the limited space in internal of the casing 100. The heat sink 25 is used for cooling down components of the redundant power supply 200 located at the input end, and the fan 24 is used for cooling down components of the redundant power supply 200 located at the output end. A better cooling effect can be achieved by using the fan 24 and the heat sink 25 in collaboration.

Moreover, it should be noted that in terms of component selection, considering a space configuration, it is suggested to use a transformer with a smaller volume, though the transformer is not illustrated in figures.

According to the above description, it is known that since the locking plate 11 of the invention extends inward to form a frame (i.e. the locking plate 11 is designed into an invagination form, as shown in FIG. 4), the casing 100 is adapted to be directly locked to the main chassis of the desktop computer from exterior to interior through the locking plate 11, i.e. the casing 100 is adapted to install the redundant power supply without changing an internal configuration of the main chassis or changing an outline dimension of the main chassis or the casing 100, such that the desktop computer has a function of a backup power. Moreover, in terms of material purchase, it is unnecessary to purchase casings of other dimensions, but only one type of the casings are used to produce general power supplies and redundant power supplies of the desktop computer, so as to effectively save the manufacturing cost.

In the redundant power supply 200 of the invention, the second circuit board 22 and the third circuit board 23 are all perpendicular to and electrically connected to the first circuit board 21, and the second circuit board 22 and the third circuit board 23 are disposed along the length direction of the second body 20 and are respectively close to two inner sidewalls of the second body 20 opposite to each other, i.e. a part of the circuit boards in the redundant power supply 200 is set in an upright manner, so as to reduce an overall volume of the redundant power supply 200, such that the redundant power supply 200 is adapted to be put into the casing 100. Moreover, the improved redundant power supply can be selected in manufacturing to complete manufacturing the backup power equipment, so as to effectively save the manufacturing cost.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A casing, comprising:
   a first body; and
   a locking plate, wherein the locking plate is installed to the first body, the first body has an internal space for accommodating two redundant power supplies, and the locking plate extends inward to form a frame and a locking member penetrates a portion of the locking plate, so as to lock the casing into a main chassis of a desktop computer,
   wherein one of the two redundant power supplies disposed in the casing comprises a second body, a first circuit board, a second circuit board and a third circuit board, wherein the first circuit board, the second circuit board and the third circuit board are all disposed in the second body, and the second circuit board and the third circuit board are all perpendicular to and electrically connected to the first circuit board, and the second circuit board and the third circuit board are disposed along a length direction of the second body and are respectively close to two inner sidewalls of the second body opposite to each other.

2. The casing as claimed in claim 1, wherein the portion of the locking plate is configured with at least one locking hole, and the casing is locked into the main chassis of the desktop computer through the locking hole being penetrated by the locking member, and the locking plate is partially folded inward to the internal space.

3. The casing as claimed in claim 2, wherein a length of the first body is 190 mm, a width of the first body is 150 mm, and a height of the first body is 86 mm.

4. The casing as claimed in claim 2, further comprising:
   at least one guide plate disposed on an inner sidewall of the internal space.

5. The casing as claimed in claim 4, further comprising:
   a separation plate formed by the guide plate by vertically extending towards a center of the internal space.

6. The casing as claimed in claim 5, wherein the separation plate is perpendicular to a length direction of the first body.

7. The casing as claimed in claim 5, wherein the separation plate is parallel to a length direction of the first body.

8. The casing as claimed in claim 1, further comprising:
   a casing circuit board;
   a direct current (DC)-to-DC converter circuit board; and
   a first power management bus circuit board, wherein the casing circuit board, the DC-to-DC converter circuit board and the first power management bus circuit board are disposed in the internal space, the casing circuit board is configured with a connection slot for plugging the redundant power supply, and the DC-to-DC converter circuit board is electrically connected to the casing circuit board.

9. A redundant power supply, being one of the two redundant power supplies and disposed in the casing as claimed in claim 8, comprising:
- the second body;
- the first circuit board, wherein the first circuit board is a main circuit board comprising an electrical terminal, the electrical terminal is located at an output end of the redundant power supply and is inserted into the connection slot of the casing;
- the second circuit board, wherein the second circuit board is a standby power supply circuit board; and
- the third circuit board, wherein the third circuit board is a second power management bus circuit board, and the third circuit board is electrically connected to the first power management bus circuit board disposed in the casing.

10. The redundant power supply as claimed in claim 9, further comprising:
- a fan disposed outside the second body and located above the electrical terminal.

11. The redundant power supply as claimed in claim 10, further comprising:
- a heat sink disposed inside the second body and located at an input end of the redundant power supply.

* * * * *